United States Patent

Rocks et al.

[15] 3,641,400

[45] Feb. 8, 1972

[54] LIGHT-EMITTING SEMICONDUCTOR RADIAL ARRAY

[72] Inventors: Eugene S. Rocks, Northport; Thomas J. Poff, Dix Hills, both of N.Y.

[73] Assignee: Sperry Rand Corporation

[22] Filed: July 16, 1970

[21] Appl. No.: 55,307

[52] U.S. Cl. ....................317/234 R, 313/108 D, 317/234 A, 317/234 H, 317/234 N, 317/234 W, 317/235 W

[51] Int. Cl. ........................................................H05b 33/00

[58] Field of Search ..............313/108 D; 317/234 H, 234 W, 317/234 A, 234 N, 235 N

[56] References Cited

UNITED STATES PATENTS

| | | | |
|---|---|---|---|
| 3,303,432 | 2/1967 | Garfinlal et al. | 331/94.5 |
| 3,353,114 | 11/1967 | Hanks et al. | 331/94.5 |
| 3,519,888 | 7/1970 | Parrish | 317/100 |
| 3,538,455 | 11/1970 | Florio | 331/94.5 |
| 3,573,568 | 4/1971 | Siegel | 317/234 |
| 3,581,162 | 5/1971 | Wheatley | 317/234 |

*Primary Examiner*—John W. Huckert
*Assistant Examiner*—William D. Larkins
*Attorney*—S. C. Yeaton

[57] ABSTRACT

A light source including a radially disposed array of laser diodes each located in a centralized region between respective angularly spaced wedge-shaped electrically conductive sections which are arranged in a circularly symmetric configuration having a casing thereabout for holding the respective diodes and wedge sections in contacting relation. Electrical excitation is applied to the structure by means of contacts affixed to two of the wedge sections devoid of a diode therebetween whereby electrical series connections of the diodes is established to induce lasing action therein.

13 Claims, 6 Drawing Figures

INVENTORS
EUGENE S. ROCKS
THOMAS J. POFF
BY
H P Terry
ATTORNEY

INVENTORS
EUGENE S. ROCKS
THOMAS J. POFF
BY
H P Terry
ATTORNEY

LIGHT-EMITTING SEMICONDUCTOR RADIAL ARRAY

BACKGROUND OF THE INVENTION

1. Field of the Invention

The present invention relates to a light-emitting semiconductor elements and more particularly to arrays of such elements compactly arranged to provide a high power per unit area light source. High power per unit area sources are useful in generating highly collimated light beams.

2. Description of the Prior Art

The fabrication and operational capabilities of light-emitting semiconductors such as gallium arsenide laser diodes, which were initially developed several years ago, are now well understood by those skilled in the art. The maximum peak power output of these elements is presently restricted to about 1 watt per mil of junction in the case of pulsed operation. In certain applications, for example, optical radar, the required light output is at least an order of magnitude greater than is attainable with a single diode. In addition, for such applications the light beam preferably should be highly collimated to assure high directional resolution and concentration of the available light on a particular object for enhancement of signal to noise ratio. The requirement for high power naturally suggests utilizing a plurality of diodes. But, then the problem arises as to how to configure the array to obtain the desired characteristics. Simply placing the diodes side by side in a linear pattern is unsatisfactory because the array then no longer approximates the point source which is necessary to obtain a well-collimated beam. On the other hand, if the diodes are clustered in a small region thermal problems must be contended with to preclude the diode temperature from becoming excessive and possibly preventing lasing action either continuously or intermittently, which in either case would result in a diminution of light power output. The requirement for compactly arranging the laser diodes could perhaps be circumvented by utilizing the array in conjunction with a long focal length lens. However, this would increase the size, weight and cost of the assembly and in any event still impair the degree of collimation to some extent.

The present invention overcomes the aforementioned problems by the provision of means for compactly arranging the diodes so as to eliminate the need for a long focal length system while simultaneously precluding the occurrence of deleterious thermal conditions normally attendant to high density packaging.

SUMMARY OF THE INVENTION

A preferred embodiment of the invention comprises a plurality of laser diodes radially disposed about a central axis intermediate respective spaced wedge-shaped sections characterized by high electrical and thermal conductivity. The arrangement of diodes and wedge sections forms a colletlike structure wherein the diodes are aligned at one end proximate the central axis to emit light in the direction thereof. Individual diodes are positioned between each of the wedge sections except for two of such sections which are adapted for connection to a source of electrical excitation. A casing encircling the collet structure holds the wedge sections securely in contact with the diodes. Preferably the collet structure is tapered to permit wedging engagement with the case so that the respective diodes and wedge sections are held in contact under suitable pressure for establishing good electrical coupling therebetween. Current is supplied to the diodes to induce lasing action therein by coupling an electrical power source across the two wedge sections which do not contain a diode between them, thereby connecting the plurality of diodes in electrical series. The compact arrangement of the diodes thus approximates a point light source from which the internally generated heat is rapidly removed by way of the comparatively large wedge-shaped conductor sections.

DESCRIPTION OF THE PREFERRED EMBODIMENT

Figure 1:
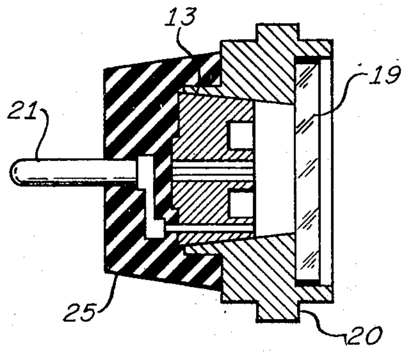
FIG. 1 is a longitudinal sectional view of a laser diode array.
Figure 2:
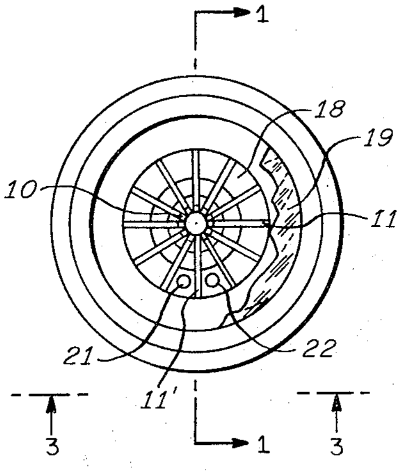
FIG. 2 is an end view of the array taken with reference to line 2—2 of FIG. 1.
Figure 3:
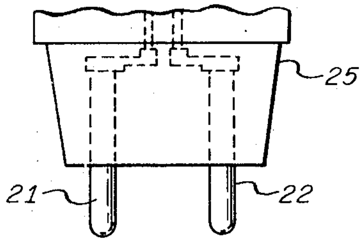
FIG. 3 is a partial top view of the apparatus of FIG. 1.
Figure 4:
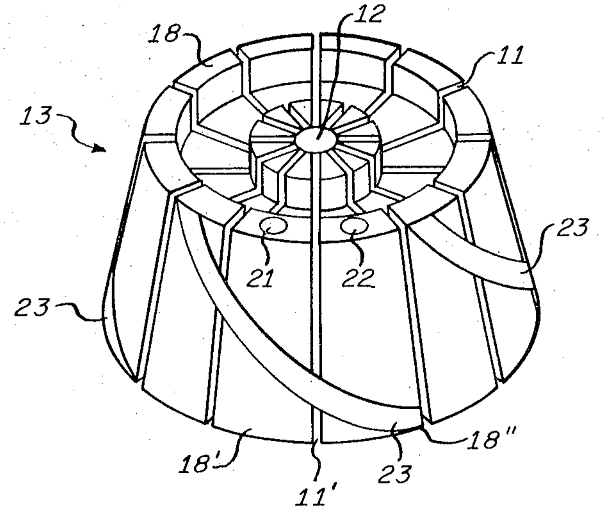
FIG. 4 is a perspective view of the collet which forms an integral part of the apparatus of FIG. 1.
Figure 5:
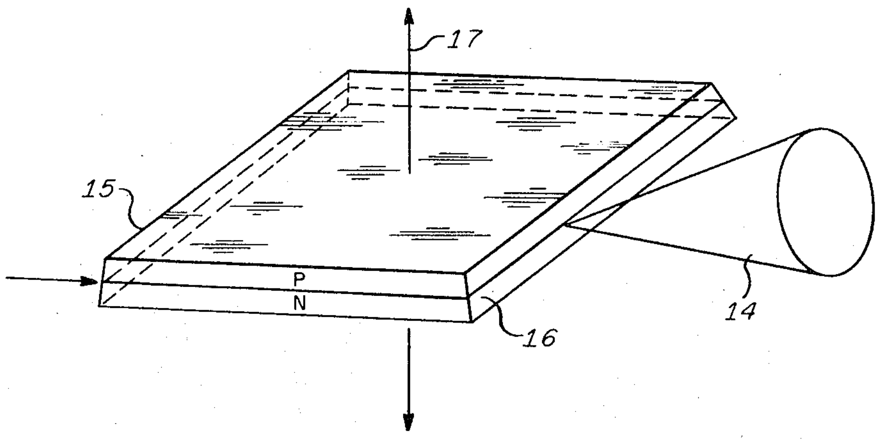
FIG. 5 is a schematic illustration of a typical laser diode incorporated in the apparatus of FIG. 1.

Referring to FIGS. 1–4, a laser diode array constructed in accordance with the principles of the present invention, comprises a plurality of laser diodes 10 disposed in respective slots 11 directed radially from a center aperture 12 extending longitudinally through a collet 13. As indicated in the figures, each diode is positioned close to the central aperture so as to minimize the area of the light source formed by the totality of the diodes. A typical laser diode, shown in FIG. 5, comprises P- and N-layers superposed to form a PN-junction device from which a light beam 14 is emitted by virtue of oscillations established between smooth polished surfaces 15 and 16 in response to a current transmitted through the diode in the direction of arrow 17. The physical dimensions of the diode are on the order of about four-thousandths of an inch thick and approximately 10-thousandths by 15-thousandths of an inch long its planar surfaces. The collet structure, which is shown in perspective in FIG. 4, consists of a plurality of wedge-shaped sections 18 arranged in a circularly symmetric fashion about the central aperture. For improved and more reliable fabrication of the array, the collet is preferably tapered from a relatively large cross section at one end (the bottom of FIG. 4) to comparatively smaller cross-sectional dimensions at the top. The function of the wedge-shaped sections, aside from holding the diodes, is to remove the heat generated by the diodes during the course of lasing operation. The large radially increasing volume of the wedges facilitates this objective provided, of course, that the material selected for the wedge sections has good thermal conductivity. In addition, as will become apparent momentarily, the wedge material must have a certain degree of resilience and high electrical conductivity. Hard copper has been found to possess suitable characteristics.

In construction of the array, the individual diodes are positioned in the slots with the light-emitting surface 16 essentially flush with the surface of the top end of the collet so that the light emitted therefrom is directed through window 19 affixed to the case 20 disposed about the collet.

Since the laser diodes are high current devices, it is desired to connect them in electrical series. This is accomplished by leaving one of the slots 11′ devoid of a diode and connecting electrical excitation terminals or pins 21 and 22 to the wedges 18′, 18″ adjacent that slot. Accordingly, an electrical series circuit is established from pin 21 to pin 22 by way of the conductive path leading through the respective diodes and wedge sections which are held in contacting relation by the case 20 encircling the collet. The aforementioned taper construction of the collet enables it to be wedged into the case so as to establish an appropriate force therebetween to hold the diodes and wedges in good electrical contact without causing damage to the diodes. The likelihood of shorting between wedge sections 18′ and 18″ can be diminished by inserting an insulating member or material such as an epoxy cement in slot 11′.

In the event that the case 20 is constructed with an electrically conductive material, means must be provided to insulate the case from the wedge sections to preclude shorting between the individual wedges. This is conveniently accomplished by affixing an electrical insulator material to the periphery of the collet. Plastic strips 23 are suitable for this purpose and can be used in conjunction with an insulating epoxy cement spread over the wedge sections prior to inserting the collet in case 20.

Figure 6:
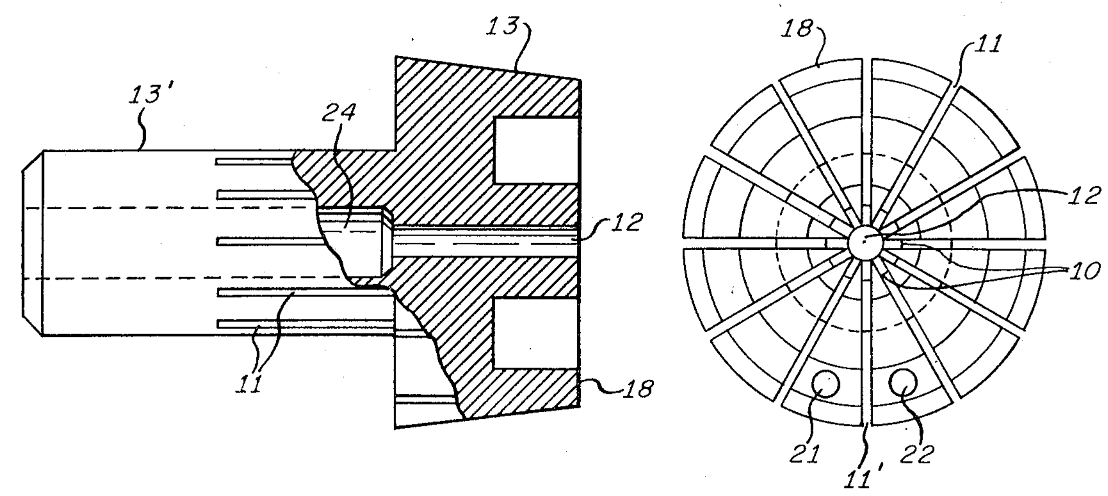
FIG. 6 is a longitudinal sectional view of the collet structure which is useful for explaining the fabrication of the laser diode array.

The procedure for assembling the device will be understood somewhat better by referring to FIG. 6. Initially, the collet 13 includes a stem 13'. The slots for receiving the diodes are formed in the collet to a depth extending into the stem by making a succession of diametral sawcuts through the collet from the smaller end, each cut being made precisely the same thickness as the diode, i.e., 4-thousandths of an inch. Prior to making the cuts, the central aperture 12 can be formed by drilling a hole through the collet to assure that the central region of the slots where the diodes are located is free of sharp edges. The holes for receiving the electrical pins can also be drilled at this time. The sawcuts are made sufficiently deep to make the collet-stem piece resilient enough to readily accommodate the insertion of all the diodes in the respective slots. Thereafter, the plastic strips are affixed to the periphery of the conductive wedge sections and the epoxy cement applied thereto preparatory to inserting the collet-stem piece into the case. As previously explained, the collet is forced into the case so as to assert sufficient pressure on the wedge sections to assure good electrical contact between the diodes and wedges. Liquid epoxy is then poured into fill hole 24 in the stem to flow into the slots and central aperture of the collet, the flow rate being controlled in a manner to preclude epoxy from flowing over the diodes. Once the epoxy is hardened and the collet securely fastened to the case, the stem is cut off at a point above the bottom of the sawcuts in readiness for attaching window 19 to the case at the light-emitting end of the collet and molding an epoxy cover 25 around the terminals over the other end of the case and collet.

While the invention has been described in its preferred embodiment, it is to be understood that the words which have been used are words of description rather than limitation and that changes may be made within the purview of the appended claims without departing from the true scope and spirit of the invention in its broader aspects.

We claim:

1. A light source comprising a collet member of electrically conductive material having a plurality of diametral slots extending therethrough parallel to the longitudinal axis of said collet thereby forming a plurality of electrically insulated wedge-shaped sections, a light-emitting element positioned in each slot except one, at the central region of said collet, proximate one end thereof and aligned to direct light out of said one end, means for connecting a source of electrical excitation across the two wedge-shaped sections which do not contain a light-emitting element between them thereby connecting said light-emitting elements in electrical series, and a case encircling said collet to hold the wedge-shaped sections and light-emitting elements in contact.

2. The apparatus of claim 1 wherein said collet has an annular groove formed in said one end concentric about said plurality of light-emitting elements.

3. The apparatus of claim 1 wherein said collet has a central aperture extending therethrough along said longitudinal axis.

4. The apparatus of claim 1 wherein said light-emitting elements are laser diodes.

5. The apparatus of claim 1 wherein said collet is tapered to permit wedging engagement with said case.

6. The apparatus of claim 5 wherein said case is constructed of an electrically conductive material, and further including an electrically insulating medium intermediate said case and said collet.

7. The apparatus of claim 6 wherein said collet is tapered from a relatively small cross section at said one end to a comparatively larger cross section at the other end.

8. The apparatus of claim 7 wherein said case extends longitudinally beyond said one end of said collet, and further including a window affixed to the longitudinally extended end of said case through which the light provided by said light-emitting element is directed, and an insulating cover member secured to the other end of said collet to form a unitary housing thereabout in cooperation with said case and said window.

9. The apparatus of claim 8 wherein said electrical excitation connecting means comprises a pair of pins each connected to a respective one of said two wedge-shaped sections and passing through said insulating cover member.

10. The apparatus of claim 9 wherein said collet has an annular groove formed in said one end concentric about said plurality of light-emitting elements.

11. The apparatus of claim 10 wherein said collet has a hole therethrough along its longitudinal axis.

12. A light source comprising a plurality of semiconductor PN-junction elements radially disposed about a central axis in the region proximate thereto and intermediate respective wedge-shaped conductive sections such that a diode is located between all adjacent wedge sections except two, a case encircling the perimeter of said wedge-shaped sections to hold the respective diodes in contacting relation therewith, and means for coupling a source of electrical excitation across said two sections thereby connecting said plurality of semiconductor elements in electrical series.

13. The apparatus of claim 12 wherein the assembly of wedge-shaped sections and semiconductor elements forms a colletlike structure with the diodes located proximate one end thereof, said structure being tapered in cross section from said one end to said other end.

* * * * *